(12) United States Patent
Matioli et al.

(10) Patent No.: US 12,412,809 B2
(45) Date of Patent: Sep. 9, 2025

(54) INTEGRATED ELECTRONIC DEVICE WITH EMBEDDED MICROCHANNELS AND A METHOD FOR PRODUCING THEREOF

(71) Applicant: ECOLE POLYTECHNIQUE FEDERALE DE LAUSANNE (EPFL), Lausanne (CH)

(72) Inventors: Elison De Nazareth Matioli, Lausanne (CH); Remco Franciscus Peter Van Erp, Lausanne (CH)

(73) Assignee: Ecole Polytechnique Federale De Lausanne (EPFL), Lausanne (CH)

( * ) Notice: Subject to any disclaimer, the term of this patent is extended or adjusted under 35 U.S.C. 154(b) by 631 days.

(21) Appl. No.: 17/784,250

(22) PCT Filed: Dec. 17, 2019

(86) PCT No.: PCT/EP2019/085627
§ 371 (c)(1),
(2) Date: Jun. 10, 2022

(87) PCT Pub. No.: WO2021/121560
PCT Pub. Date: Jun. 24, 2021

(65) Prior Publication Data
US 2023/0037442 A1     Feb. 9, 2023

(51) Int. Cl.
*H01L 23/473*     (2006.01)
*B81C 1/00*       (2006.01)
(Continued)

(52) U.S. Cl.
CPC ........ *H01L 23/473* (2013.01); *B81C 1/00071* (2013.01); *H01L 21/764* (2013.01); *H01L 23/46* (2013.01)

(58) Field of Classification Search
CPC ............. H01L 23/473; H01L 21/76289; H01L 21/764; H01L 23/46; H01L 23/367; B81C 1/00071
See application file for complete search history.

(56) References Cited

U.S. PATENT DOCUMENTS

| 4,450,472 A | 5/1984 | Tuckerman |
| 5,403,752 A * | 4/1995 | Bruchhaus ........... G02B 6/1221 |
| | | 438/54 |

(Continued)

FOREIGN PATENT DOCUMENTS

| EP | 3327772 A1 | 5/2018 |
| EP | 3381690 A1 | 10/2018 |

OTHER PUBLICATIONS

International Search Report and Written Opinion mailed Sep. 7, 2020, in international patent application No. PCT/EP2019/085627, 12 pages.

(Continued)

*Primary Examiner* — Yasser A Abdelaziz
(74) *Attorney, Agent, or Firm* — Blueshift IP; Robert Plotkin

(57) ABSTRACT

The present invention relates to a method for fabricating an integrated electronic device with a microchannel, comprising the steps of: —Providing a homogeneous or heterogeneous substrate with one or more layers of material, respectively; —Forming at least one trench in the upper surface and through the upper layer using an etching process, particularly using a high aspect ratio etching process; —Sealing the trench by closing the opening of the trench on an upper surface of the upper layer.

22 Claims, 11 Drawing Sheets

(51) Int. Cl.
*H01L 21/764* (2006.01)
*H01L 23/46* (2006.01)

(56) References Cited

U.S. PATENT DOCUMENTS

| | | | |
|---|---|---|---|
| 5,998,240 | A | 12/1999 | Hamilton |
| 6,093,330 | A * | 7/2000 | Chong ............... B81C 1/00071 |
| | | | 216/2 |
| 6,242,778 | B1 | 6/2001 | Marmillion |
| 6,521,516 | B2 | 2/2003 | Monzon |
| 7,139,172 | B2 | 11/2006 | Bezama |
| 7,741,159 | B2 | 6/2010 | Oyamatsu |
| 9,484,284 | B1 | 11/2016 | Gambin |
| 2003/0003698 | A1 | 1/2003 | Monzon |
| 2004/0084726 | A1 | 5/2004 | Kim |
| 2004/0248349 | A1 * | 12/2004 | Renna .................. H01L 21/764 |
| | | | 257/E21.573 |
| 2006/0002088 | A1 | 1/2006 | Bezama |
| 2006/0207972 | A1 | 9/2006 | D Arrigo Guiseppe |
| 2010/0127390 | A1 | 5/2010 | Barth |
| 2011/0042046 | A1 | 2/2011 | Lehmann |
| 2015/0194363 | A1 | 7/2015 | Jun |
| 2016/0061679 | A1 * | 3/2016 | Adams .................. G01L 9/0027 |
| | | | 73/717 |
| 2018/0025962 | A1 | 1/2018 | Dede |

OTHER PUBLICATIONS

De Boer et al., "Micromachining of Buried Micro Channels in Silicon," Journal of Microelectromechanical Systems, IEEE Service Center, US, vol. 9, No. 1, Mar. 1, 2000, pp. 94-103, XP011450823, ISSN: 1057-7157, DOI: 10.1109/84.825783.

Zellner et al., "A Fabrication Technology for Three-Dimensional Micro Total Analysis Systems," Journal of Micromechanics and Microengineering, Institute of Physics Publishing, Bristol, GB, vol. 20, No. 4, Apr. 1, 2010, pp. 45013, XP020175381, ISSN: 0960-1317.

* cited by examiner

INTEGRATED ELECTRONIC DEVICE WITH EMBEDDED MICROCHANNELS AND A METHOD FOR PRODUCING THEREOF

TECHNICAL FIELD

The present invention relates to integrated electronic devices with embedded fluid channels. Particularly, the present invention relates to integrated electronic devices with improved fluid cooling.

TECHNICAL BACKGROUND

Electronic devices are continuously getting smaller and more powerful. Consequently, more heat is generated within a smaller footprint, and these high heat fluxes cause excessive temperature rises that are detrimental for reliability and performance. Overheating is therefore one of the major obstacles for the development of new generation of devices.

Examples of semiconductor devices that experience high heat fluxes are: logic devices, as the dimensions of CMOS technology shrink, radio-frequency (RF) applications such as amplifiers and monolithic microwave integrated circuits (MMICs), power electronics applications, optoelectronic applications and the like.

State of the art devices demonstrate heat generation surpassing the limit of cooling that air-based solutions can provide, and most approaches that aim at pushing the limits of air cooling, like sub-cooling the air, which is commonly employed in datacenters, are extremely energy consuming.

As a result, cooling of integrated electronic devices accounts to a significant share of the energy consumption of operating these devices. Hence, there is a clear need for more efficient cooling of integrated electronic devices.

Key requirement for high performance cooling is a high heat transfer coefficient. To this end, forced liquid or two-phase cooling offers an orders of magnitude better cooling performance compared to air-based cooling methods. In a conventional liquid cooling approach, the semiconductor die is packaged, mounted on a PCB or a module and brought in contact with cooling unit that contains flowing coolant. Although this approach outperforms an air-based cooling system, there are two major problems: The large distance and numerous poor thermal interfaces between the junction of the semiconductor die (where the heat is generated) and the liquid stream causes a high thermal resistance. Secondly, because of the ineffective heat transfer in conventional millimeter-sized pipes and the high overall thermal resistance, a high flow-rate through the channels is needed, thus requiring bulky and energy-consuming pumps.

Approaches aiming to greatly reduce the thermal resistance have previously been presented, where channels are directly embedded inside the semiconductor die. This so-called "Direct cooling" approach eliminates thermal interfaces and brings the liquid as close as possible to the heat source. Due to the low thermal resistance, much higher heat fluxes can be managed.

In the document U.S. Pat. No. 4,450,472 A a semiconductor chip having improved heat dissipation capability is provided. The back surface of the semiconductor chip is provided with microscopic channels defined by fins in intimate contact with the chip. A cover plate is affixed to the fins to enclose the channels for the laminar flow of coolant fluid.

Document U.S. Pat. No. 5,998,240 A1 discloses a method of extracting heat from a solid-state device wherein a plurality of microchannel grooves having a relatively thin layer of electrically conductive material on all surfaces thereof is formed in one region of a semiconductor body. The semiconductor body comprises a die of silicon or silicon carbide and includes a plurality of active semiconductor devices formed in another region of the same said semiconductor body.

These early approaches use high aspect-ratio microchannels for cooling purposes etched directly in the backside of a silicon device. Channels are sealed by bonding. Such a solution could cool down state-of-the art heat fluxes and is therefore a promising approach for high heat-flux application. However, several problems are associated with the afore-mentioned embedded microchannel cooling that are hampering large-scale adoption of this technique.

Document U.S. Pat. No. 7,139,172 B2 discloses a microchannel cooling of integrated circuits, with microchannels fabricated in the backside of the die thereby providing high performance solutions by using the 3D manifold structure. However, multiple bonding steps are required.

U.S. Pat. No. 7,741,159 B2 discloses a method of manufacturing a semiconductor device, wherein in an upper surface of a semiconductor substrate in which a semiconductor element is to be formed, a plurality of trenches with an equal depth is formed such that said plurality of trenches extend in a first direction. A channel is formed which receives a cooling fluid in the upper surface of the semiconductor substrate by annealing the semiconductor substrate such that the semiconductor substrate viscously fluidifies.

U.S. Pat. No. 6,521,516 B2 discloses a semiconductor substrate having a buried microchannel, a first trench and a second trench. The buried microchannel has two ends, wherein each end of the microchannel is coupled to one of the first trench and the second trench wherein the first trench and the second trench each have a top and a bottom wherein the top of the trench is coupled to a surface of the substrate, and a fluid in the microchannel. The method proposed therein allows to form buried microchannels without affecting the top layer by implanting reactive ions under the surface, followed by a wet etch that dissolves the part where ions are implanted. This method can, however, not obtain a high aspect ratio of channels and gives limited control over the shape of the channels. Furthermore, the ion implantation happens through the top layer and can thus damage the semiconductor over a large area.

US 2006/0207972 A1 discloses a process for realizing buried microchannels in an integrated structure comprising a monocrystalline silicon substrate. The process forms in the substrate at least one trench. A microchannel is obtained starting from a small surface port of the trench by anisotropic etching of the trench. The microchannel is then completely buried in the substrate by growing a microcrystalline structure to enclose the small surface port.

SUMMARY OF THE INVENTION

According to the present invention, a method for fabricating an integrated electronic device according to claim 1 and an integrated electronic device according to the further independent claim are provided.

Further embodiments are indicated in the depending subclaims.

According to a first aspect a method for fabricating an integrated electronic device with a microchannel, comprising the steps of:
  Providing a homogeneous or heterogeneous substrate with one or more layers of material, respectively;

Forming at least one trench in the upper surface and through the upper layer using an etching process, particularly using a high aspect ratio etching process;

Sealing the trench by closing the opening of the trench on an upper surface of the upper layer.

The present invention describes an integrated electronic device with embedded microchannels integrated in a substrate, as well as fabrication methods to achieve such an integrated electronic device, where the microchannels are in close proximity of the active area of the semiconductor of the upper layer. The microchannels can be used to flow matter (inorganic, organic, biological) in liquid or gaseous states through a semiconductor device, particularly close to active areas of transistors, diodes, LEDs, lasers, sensors, detectors and the like. The proposed integrated electronic device is practical for applications such as cooling, to significantly increase the power density of devices, as well as many others such as sensing, biodetection, and other microfluidic applications.

As can be seen from the prior art discussed above, high-aspect ratio channels can be easily fabricated in a silicon wafer. However, sealing the channels usually require a wafer bonding step that is cumbersome and costly. Furthermore, these bonding steps also create interfaces that cause thermal boundary resistances, which reduces thermal performance, and the mismatch in material properties between the two bonded surfaces may create reliability issues. Moreover, the additional processing steps required to create a chip with embedded microchannels result in a more complex fabrication process. Also, microchannels formed from the backside of the substrate are distanced to active areas of components to efficiently dissipate heat therefrom.

Additionally, the prior art methods provide techniques for forming microchannels after other components such as integrated electronic circuitry has been embedded. This narrows the variety of technologies available for forming microchannels as the process may affect the function of the other components. Moreover, after forming the microchannels the substrate is usually not in a condition to integrate electronic components due to the generation of non-semiconductor outer layers or due to negative effects of the process for forming the microchannels on electrical properties of the semiconductor substrate.

According to the above method, it is described the fabrication of an integrated electronic device with a substrate-embedded microchannels as heatsink or for other purposes that addresses these afore-mentioned challenges. In the proposed method, small trenches are etched in the top of the semiconductor substrate, and then subsequent etching steps may be performed through these trenches to realize cavities underneath the top semiconductor surface. The trenches in the upper surface are then closed by coalescing the top surface, either by adding/applying a material that is part of the device structure, such as metal pads or contacts, or by growing a new layer of active semiconductor on top.

The above process allows that the microchannels can be co-designed with the other components' topology, e.g. to obtain an optimal thermal coupling between a component hot-spot and a microchannel as a heat sink. Also, above method allows to form an arbitrary heat sink structure which can be monolithically embedded in the substrate, so that a conventional fabrication method can be used to realize other components, such as electronic circuitry, in the substrate.

Particularly, the proposed method allows to create hermetically sealed microchannels in a substrate, with channels in the range of 1-500 µm, where the channels are sealed without any required wafer bonding step.

In above method for fabricating an integrated electronic device on a wafer, microchannels are embedded inside the semiconductor substrate. Instead of etching microchannels from the backside (side opposite to the side where electronic components are embedded) of the substrate, microchannels are fabricated (by applying process steps) from the active side (side where electronic components shall be embedded), the fabrication method provides creating small trenches from the top, particularly followed by isotropic etching through this trench to create cavities right underneath the active area of the device. This results in minimum impact onto the active area of the semiconductor, particularly when the trenches are located in a non-active position on the surface of the wafer such as below contact pads, metal lines, capacitors or the like, while still allowing the fabrication of larger microchannels underneath. The close proximity of the cavities forming the microchannels to the active area of the components to be formed on the upper side provides improved cooling performance if microchannels are used for a cooling liquid flow due to reduced conduction resistance as well as due to the absence of most thermal boundary resistances.

The so obtained microchannels cannot only be used to cooling, but the same platform can also be used for a range of microfluidic applications such as sensing, diagnostics or sample processing.

After the generation of the microchannels under the active semiconductor area of the device, the trenches can be sealed by growing semiconductor material onto the upper surface. This way, a hermetically sealed structure can be obtained with integrated cooling channels. No bonding steps are required to seal the microchannels. If this approach is performed on a wafer-scale, this wafer can be passed on to the chip-manufacturing company, who can process it as any other wafer.

The proposed top-side fabricated integrated electronic device can e.g. be implemented as GaN-on-Silicon. This is a semiconductor structure that has a thin (several micrometers thick) upper layer of GaN (epistructure), which functions as the active area for the electronic and/or optoelectronic components, on top of a 1 mm thick silicon substrate, which functions as a cheap carrier (support layer) and has no additional functionality. This structure is cost-effective, since growing a thick, bulk substrate of GaN is technically expensive. However, by using the proposed solution, the cost-effective silicon substrate can be turned into a high-performance heat sink. Moreover, it enables the following important approaches to solve the problems stated before:

Microchannels, fabricated such as described above, enable high heat fluxes due to the increased heat transfer coefficient and effective surface area when used for cooling purposes. However, with these small dimensions, high pressures are required to obtain a sufficiently high coolant flow rate. To obtain these high pressure, large pumps are required, which causes problems if space is limited. The high pressure also puts more demands on the entire liquid cooling loop, since every single connection in the system needs to be more robust. The straight design of the microchannels will result in a temperature gradient over the surface, which causes internal stress due to thermal expansion, creating reliability issues. To reduce temperature non-uniformity, higher flow-rates are required, which increase the erosion of the microchannels and thus reduce lifetime.

The problem of high pressure drop, temperature uniformity, reliability and pumping concerns can be addressed by adopting a manifold-structure, where the length of the microchannels are can be kept short, and wherein connection to an inlet and outlet is facilitated.

According to an embodiment, a cavity etching process may be performed through the trench to form the microchannel. Through this opening, a cavity is realized below the upper surface of the substrate. Such a cavity can contribute to forming a microchannel.

Particularly, the cavity etching process may be an isotropic etching process made in a layer of the heterogeneous substrate which is not the upper layer.

According to an embodiment, the cavity etching process may be followed by a wet or dry oxidizing step growing an oxide layer at the inner walls of the cavity/microchannel for electrical isolation.

Moreover, the trench may be sealed by closing the opening of the trench on the upper surface by means of at least one of
- an epitaxial growth of a semiconductor material and
- a deposition of a dielectric, semiconducting or conductive material, by means of at least one of evaporation, sputtering, chemical vapor deposition, physical vapor deposition, coating, and atomic layer deposition; and
- a deposition of an isolating material.

The deposition of metal or semiconductor material may be used to form electrical interconnects of electrical components formed in the active area, a heat spreader or a separate temperature sensor. In case of a biosensor, it can also be functionalized as a biorecognition element instead.

Furthermore, at least an upper layer of the substrate may be (configured as) a semiconductor layer that provides an active area.

It may be provided that the substrate is made of a homogeneous material, which particularly includes one of GaN, $Ga_2O_3$, Si, AlGaN, InGaAs, and GaAs.

Alternatively, the substrate may be made of a heterogeneous material, which particularly comprises of a plurality of layers at least one including semiconductor materials including one of GaN, $Ga_2O_3$, Si, AlGaN, InGaAs, and GaAs.

Particularly, a support layer of the substrate may be made of a non-semiconductor material such as $SiO_2$ or sapphire, or of a semiconductor material such as Si, SiC or diamond.

According to an embodiment, the cavities may be formed as longitudinal microchannels.

Furthermore, dot shaped trenches may be provided along the extension of the microchannel to be formed with a distance to each other, wherein by a cavity etching process a cavity is etched through each of the trenches underneath the upper layer so that the formed cavities join to form the microchannel with a wavy wall structure.

Furthermore, the trench may be etched by an isotropic or anisotropic etching process.

According to an embodiment, an inlet and/or outlet channel may be formed on a backside of the substrate, particularly by etching a backside trench from the backside until the microchannels are reached.

Particularly, the backside trenches are longitudinal and extend across the extension of the microchannels.

According to an embodiment, an electronic component is formed in the upper layer, particularly after the trench has been sealed.

Furthermore, inlet and/or outlet port is provided through the upper layer and/or through the support layer.

It may be provided that a manifold structure including an inlet and/or an outlet port is provided through the support layer, wherein the manifold structure has two interlaced comb-shaped channel structures so that between neighboring teeth of different channel structures the microchannels are arranged so that fluid may flow from one channel structure to the other channel structure via the microchannels.

According to a further aspect, an integrated electronic device with a microchannel is provided, produced by the steps of:
- Providing a homogeneous or heterogeneous substrate with one or more layers of material, respectively; wherein at least an upper layer of the substrate is a semiconductor layer provides an active area;
- Forming at least one trench into the upper surface and through the upper layer using an etching process, particularly using a high aspect ratio etching process;
- Sealing the trench by closing the opening of the trench on an upper surface of the upper layer.

According to a further aspect, an integrated electronic device is provided comprising:
- a homogeneous or heterogeneous substrate with one or more layers of material, respectively; wherein at least an upper layer of the substrate is a semiconductor layer provides an active area;
- at least one trench in the upper surface and through the upper layer;
- a seal, at least partly including an active semiconductor material, onto the opening of the trench on an upper surface of the upper layer to form a microchannel for flowing a fluid.

Furthermore, the microchannel may be formed directly under the upper layer, wherein the microchannel extends underneath active electrical components formed in the active area.

Moreover, the trench may be sealed by means of at least one of
- an epitaxial growth of a semiconductor material,
- a deposition of a dielectric, semiconducting or conductive material, by means of at least one of evaporation, sputtering, chemical vapor deposition, physical vapor deposition, coating, and atomic layer deposition; and
- a deposition of an isolating material.

According to an embodiment, the substrate is made of a homogeneous material, which particularly includes one of GaN, $Ga_2O_3$, Si, AlGaN, InGaAs, and GaAs.

It may be provided that the substrate is made of a heterogeneous material, which particularly comprises of a plurality of layers at least one including semiconductor materials including one of GaN, $Ga_2O_3$, Si, AlGaN, InGaAs, and GaAs.

Particularly, a support layer of the substrate may be made of a non-semiconductor material such as $SiO_2$ or sapphire, or of a semiconductor material such as Si, SiC or diamond.

Further, dot shaped trenches may be provided along the extension of the microchannel with a distance to each other, wherein the microchannel has a wavy wall structure.

According to a further embodiment, an inlet and/or outlet channel may be provided as backside trenches on a backside of the substrate.

Particularly, the backside trenches may be longitudinal and extend across the extension of the microchannels.

Also, an electronic component may be provided in the upper layer.

BRIEF DESCRIPTION OF THE DRAWINGS

Embodiments are described in more detail in conjunction with the accompanying drawings in which:

FIGS. 4a-4i show a process flow for embedding a cavity in the substrate with a top surface semiconductor layer on a support layer (semiconducting or not), with an additional insulating layer in between.

Figure 1:
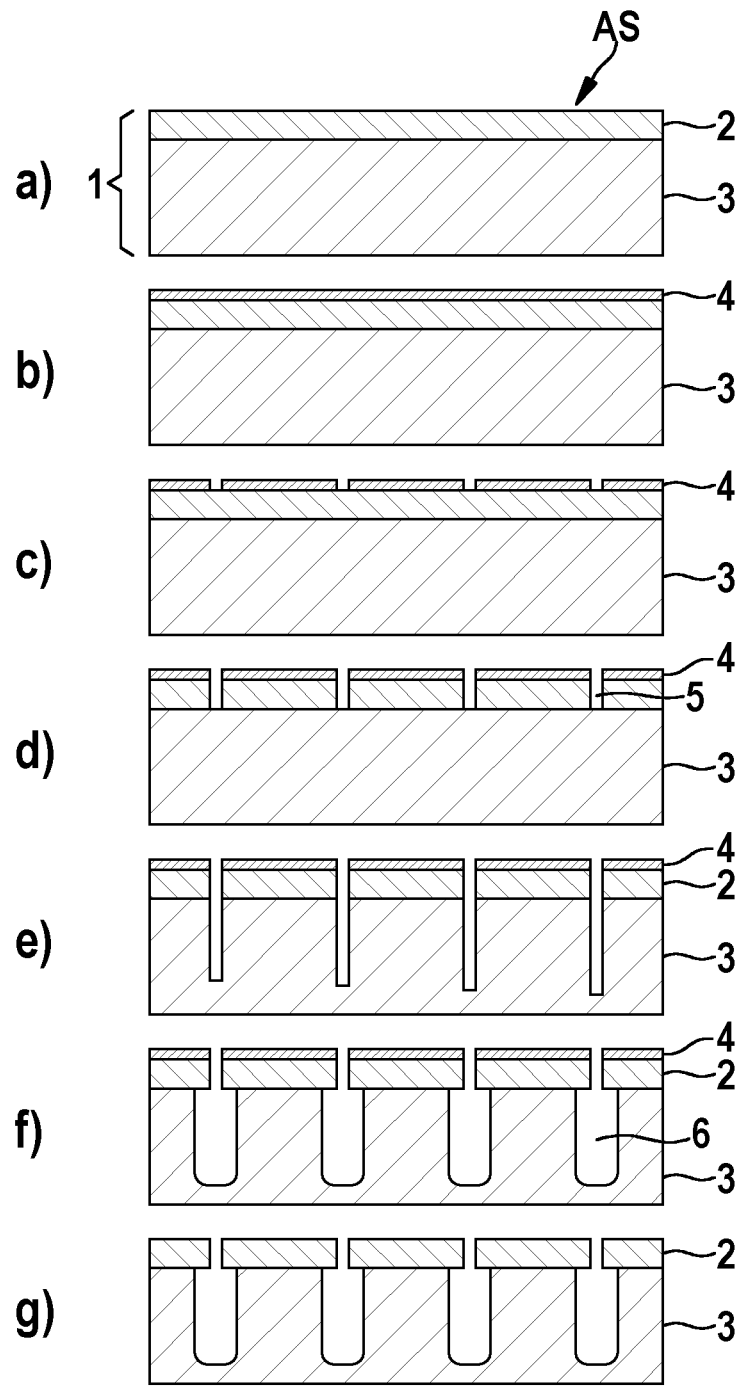
FIGS. 1a-1i show a process flow for embedding a cavity underneath a semiconductor epitaxial upper layer inside a semiconductor or insulating support layer.
Figure 1:
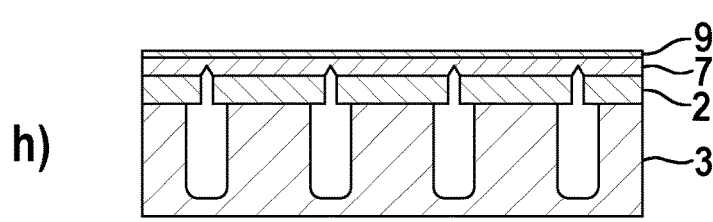
Figure 1:
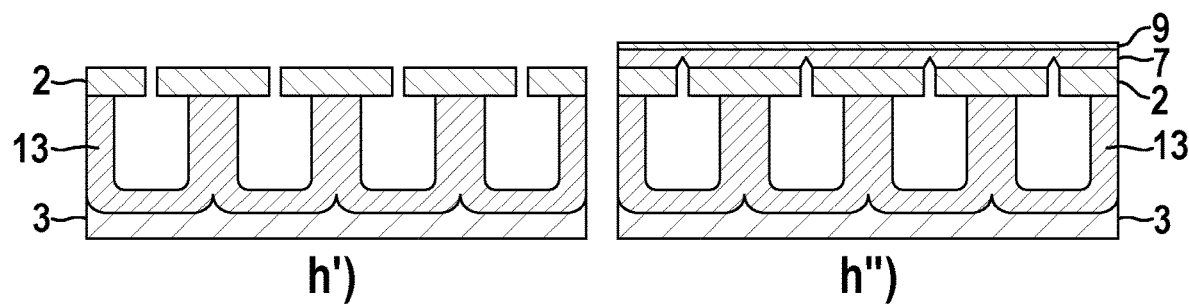
Figure 1:
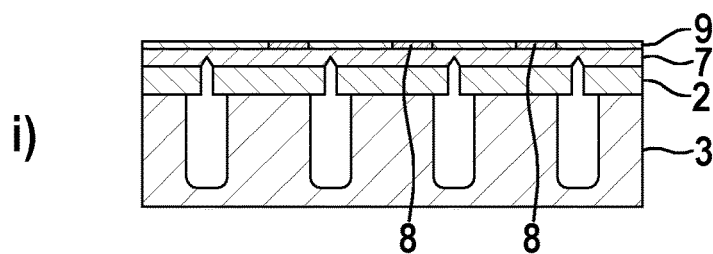

In the drawings, each identical or nearly identical component that is illustrated in various figures is represented by a like reference sign. For purposes of clarity, not every component may be labeled in every drawing. The drawings are not necessarily drawn to scale, with emphasis instead being placed on illustrating various aspects of the techniques and devices described herein.

DESCRIPTION OF EMBODIMENTS

FIGS. 1a-1i illustrate a process flow with several fabrication steps to obtain embedded microchannels inside a semiconductor device. Each of the FIGS. 1a-1i shows a cross-sectional view through the formed device after the respective fabrication step.

FIG. 1a shows the example initial state where a substrate 1 is provided including a semiconductor epitaxial layer as an upper layer 2 and a non-native support layer 3, such as a semiconductor wafer or an insulating substrate. As an example, this could be represented by an (AlGaN/GaN) epitaxial layer on a silicon substrate. Also, other semiconductor layer—support layer—combinations can be applied here, where the semiconductor layer can consist of a material such as group IV elemental or compound semiconductors (Silicon, Germanium, Diamond, SiGe), III-V compounds (GaN, GaAs, AlN, BN, InSb, InP), II-VI compounds (ZnSe, CdSe), Oxides ($Ga_2O_3$, ZnO), along with their ternary and quaternary. The support layer can consist of, but not limited to, silicon, AlN, diamond, $Ga_2O_3$, SiC, $Al_2O_3$, $SiO_2$, plastics as well as any of the aforementioned materials. Examples include InGaAs on Si, (AlGaN/GaN) on SiC, (AlGaN/GaN) on sapphire, AlN on Si, AlGaInP on GaAs, InAs on Si, GaP on Si.

Thereafter, as shown by state of FIG. 1b, an etching mask layer 4 is deposited on the upper surface which forms the active side AS of the wafer. The etching mask layer 4 may be applied by a coating process of a photoresist, such as by a spin coating process. Alternatively, the etching mask may also be deposited using a chemical vapor deposition or physical vapor deposition method such as sputter deposition or plasma-enhanced chemical vapor deposition, in which case the etching mask may be a material such as $SiO_2$, SiN, Al or Ni. The active side AS of the wafer is the side where electronic components shall be integrally formed thereon/therein.

As shown in FIG. 1c the etching mask layer 4 is lithographically patterned and opened as commonly known in the art. In case of a photoresist etching mask, a development step will open the mask after exposure. In case of a non-photoresist mask, the patterning of the photoresist is followed by an etching step to transfer the pattern from the photoresist to the mask.

The created pattern is used, as shown in FIG. 1d, to etch trenches 5 completely through the epitaxial layer (upper layer 2) until support layer 3, i.e. the support layer of the substrate 1 is reached. This etching can have a high selectivity on the material of the epitaxial layer (upper layer 2), such as a $Cl_2$+Ar based inductively coupled plasma etching in case of an AlGaN/GaN epilayer.

This is followed as shown in FIG. 1e by a consecutive etching step, particularly a high-aspect ratio etching step, through the epitaxial layer (upper layer 2) to deepen the trenches 5 formed in step of FIG. 1d. Here, an anisotropic etch was performed to obtain a large aspect ratio to define the depth of the microchannels to be formed. To achieve a high aspect ratio, a deep reactive ion etching process can be used, such as the Bosch process (a high-aspect ratio plasma etching process as known in the art) in case of a silicon support layer.

To form a cavity 6 in the support layer 3, as shown in FIG. 1f, an isotropic etch is performed through the trench 5 in the upper layer 2 and into the support layer 3 to obtain a wider microchannel. For instance, this etching can be performed using XeF2 for isotropically dissolving silicon as the material of the support layer 3. An anisotropic wet etch, such as KOH, can also be used to increase the size/width of the cavity 6. Widening of the trenches 5 allows to enlarge the microchannels underneath the active area without affecting the usable size of the upper surface for integrating electronic components.

Next, the etching mask layer 4 is removed, as shown in FIG. 1g.

Thereafter, as shown in FIG. 1h, an epitaxial growth is performed to form an active semiconductor top layer 7 on the upper surface of the upper layer 2 to coalesce/seal the openings 5 of the cavities 6 in the upper layer 2.

An additional semiconductor active layer 9 can be provided on top of the top layer 7. The semiconductor active layer 9 is used to implement electronic or optoelectronic components 8.

The semiconductor top layer 7 and semiconductor active layer 9 may be grown during the same MOCVD process: As a material for the epitaxial (MOCVD) growth AlGaN and GaN can be used to form an AlGaN/GaN heterostructure on top of the upper layer 2. In case of an GaN HEMT, the material of semiconductor top layer 7 is GaN, and the material of the semiconductor active layer 9 is AlGaN. Further, contact pads, which could be metal, can be added on top of top layer 7.

For high-voltage applications as well as for RF-applications, it is desirable to have good electrical isolation between the epilayer and the substrate. Furthermore, in case of the monolithic integration of multiple power devices on the same substrate, it is crucial to also have electrical isolation between the individual devices on the same die. A possible way to achieve this is by growing a GaN epilayer on an SOI wafer, where the insulator layer (SiO2) provides the electrical isolation. However, this approach is costly and deteriorates the thermal performance due to the poor thermal conductivity of the SiO2 layer.

A similar electrical isolation can be obtained in a more effective way by performing and oxidation step after the microchannel formation, as shown in FIG. 1g. Providing the at the non-native support layer 3 is made of a semiconductor such as silicon, either a wet or dry oxidation process can be used to grow an oxide layer 13 at the walls of the cavities 6 as shown in FIG. 1h'. Thereafter, as shown in FIG. 1h" the semiconductor top and active layers 7, 9 are grown as described above.

The oxidation process may be performed so that the oxide layer 13 penetrates sufficiently deep into the non-native support layer 3 (such as silicon), the oxide layer 13 (such as SiO2) of adjacent channels will coalesce and form solid SiO2-pillars that provide an electrical isolation between the semiconductor top and active layers 7, 9 and the non-native support layer 3. The benefit of this approach is that a cheap standard silicon substrate as non-native support layer 3 can be used, which reduces cost. Secondly, the microchannel is still in direct contact with the semiconductor top and active layers 7, 9. Flowing coolant through the so formed channels can provide a high level of cooling directly to the semiconductor active layer 9, despite the poor thermal conductivity of the oxide layer 13.

Each of the FIGS. 2a-2g shows a cross-sectional view through the formed device after the respective fabrication step according to a further embodiment. FIGS. 2a-2g show an alternative approach, where the substrate 1 is provided including a semiconductor epitaxial layer as the upper layer 2, such as GaN, and a semiconductor or non-semiconductor layer as the support layer 3, such as a silicon or sapphire wafer. In this process the microchannels are only embedded in the upper layer 2 instead of in the support layer 3. This can for example be applied to the case of a semiconductor layer (epitaxial layer 2) on a support layer 3 such as sapphire or diamond that does not allow high aspect ratio etching. The process steps 2a to 2d substantially correspond to the steps of FIGS. 1a-1d.

Figure 2:
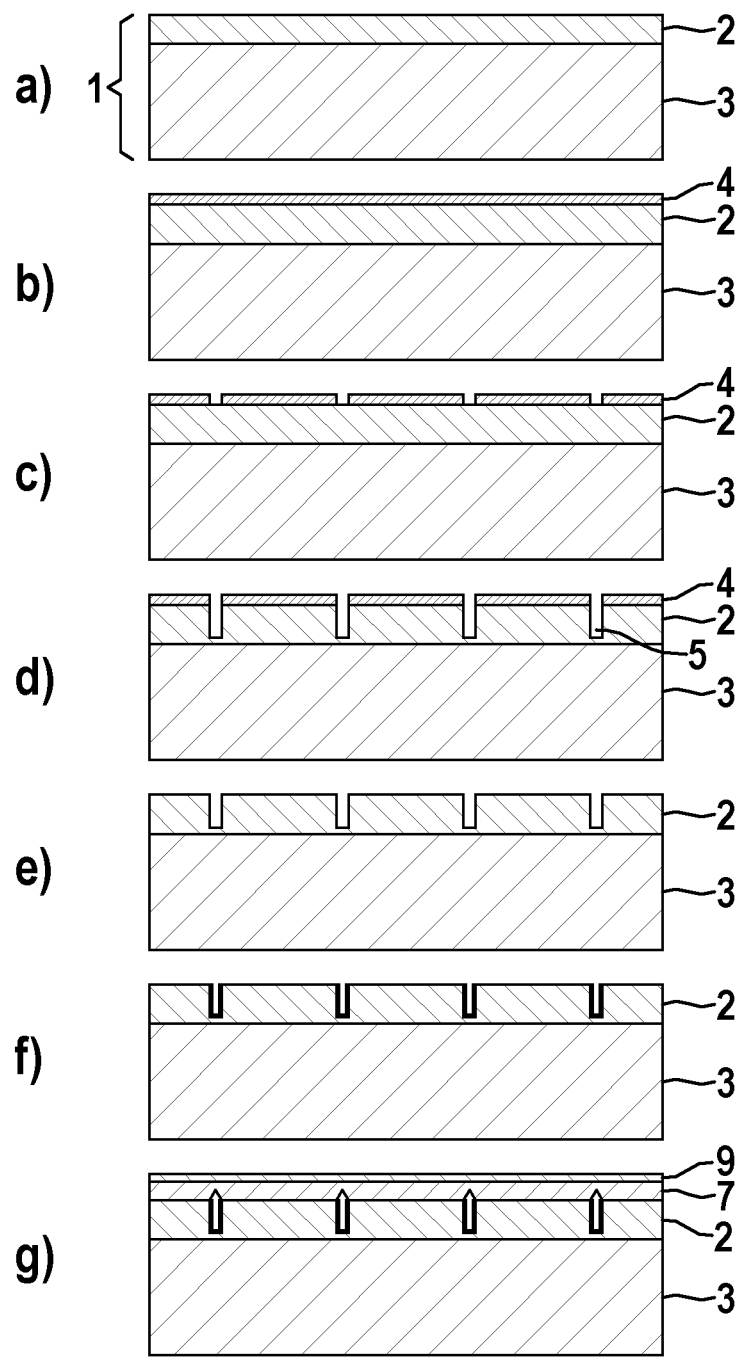
FIGS. 2a-2g show a process flow for embedding a cavity in the inner of a semiconductor epitaxial upper layer on a semiconductor or insulating support layer.

In process step of FIG. 2d, the trenches 5 are formed by an anisotropic etching through the upper layer 2 until the support layer 3 is reached. Instead of etching the trench 5 all the way through the upper layer 2, the upper layer 2 can be partially etched so that the trenches 5 extend only partially through the upper layer 1, which is shown in FIG. 2d.

Process steps of FIGS. 2e, 2f and 2g show removal of the etching mask layer 4 and the deposition of a semiconductor top layer 7 and a semiconductor active layer 9 by e.g. epitaxial growth to close the openings of the trenches 5 and to provide an active area of the electronic or optoelectronic components.

As shown in FIG. 2f, before regrowth of the top layer 7, a regrowth mask could be deposited on all surfaces of the cavities to prevent regrowth inside the cavity in case MOCVD is used for closing the cavity, as this would reduce the size of the cavity. For this purpose, $SiO_2$ or SiN can be used as a regrowth mask. Instead of uniformly sealing the cavity 6/microchannel, the opening can also locally be sealed. Sealing can be achieved using various deposition methods including chemical vapor deposition (including but not limited to: MOCVD, low pressure chemical vapor deposition, plasma-enhanced chemical vapor deposition, microwave-assisted chemical vapor deposition), atomic layer deposition, electron-beam evaporation, sputtering, electrodeposition, and spin coating. The resulting seal may function as a conductor, such as a metal pad or a doped semiconductor, isolator, in case of an oxide or a polymer, or a semiconductor.

Instead of a multi-layer structure as described in FIGS. 1a-1i and FIGS. 2a-2g, this can also be applied to a multi-layer structure as upper layer 2, including layers 2', 2'' as shown in FIGS. 3a-3j.

Each of the FIGS. 3a-3j shows a cross-sectional view through the formed device after the respective fabrication step according to a further embodiment. FIGS. 3a to 3j show the process steps for a heterogeneous epitaxial layer as upper layer 2, such as AlGaN/GaN on Silicon. In case all materials have a good etching selectivity to the substrate, the same approach as in FIGS. 1a-1f can be used.

The main difference of the process illustrated in FIGS. 3a to 3f is that the cavities are sealed by a local deposition of a sealing material, such as metals, dielectrics or semiconductors in contrast to the deposition of a uniform semiconductor layer.

Figure 3:
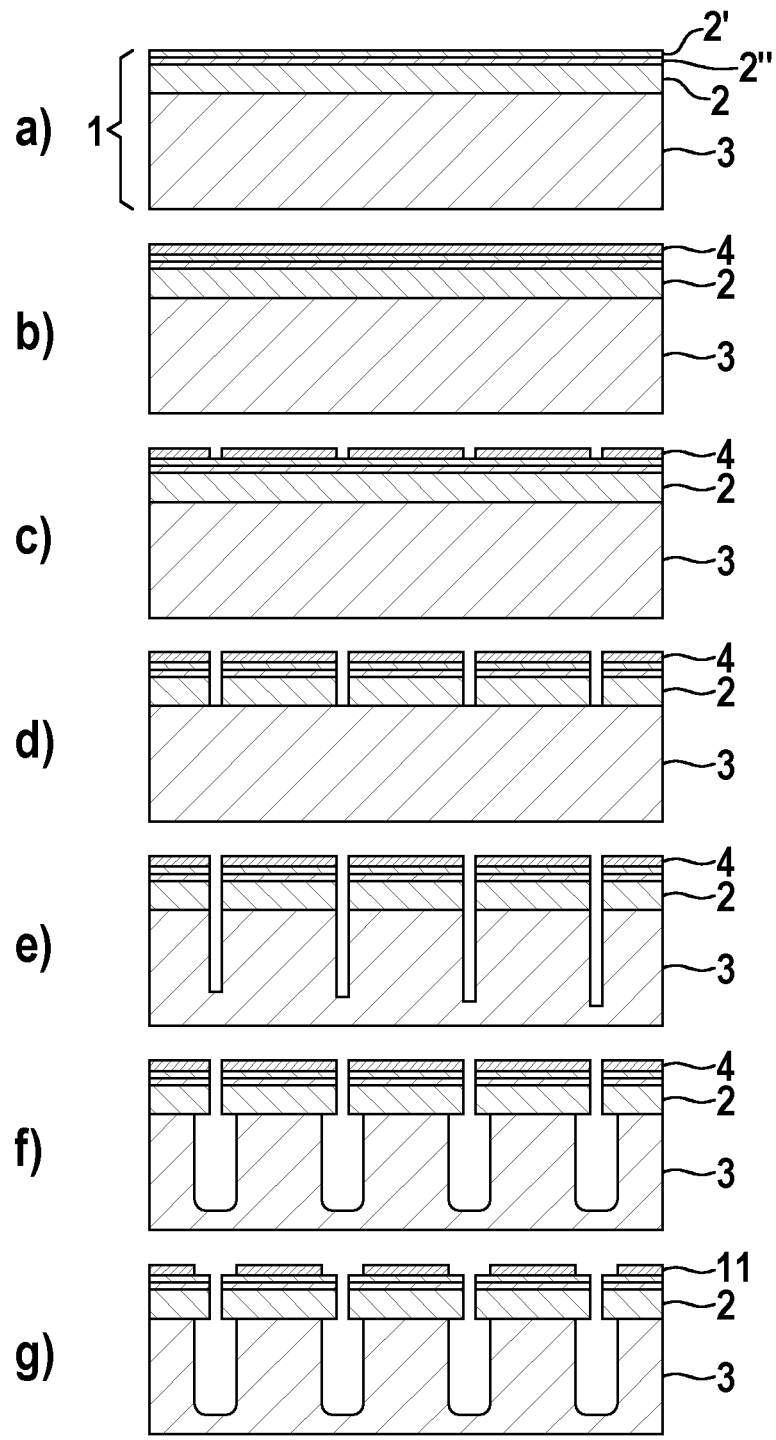
FIGS. 3a-3j show a process flow for embedding a cavity in the substrate with a heterogeneous or homogeneous upper layer on a semiconductor or insulating support layer.
Figure 3:
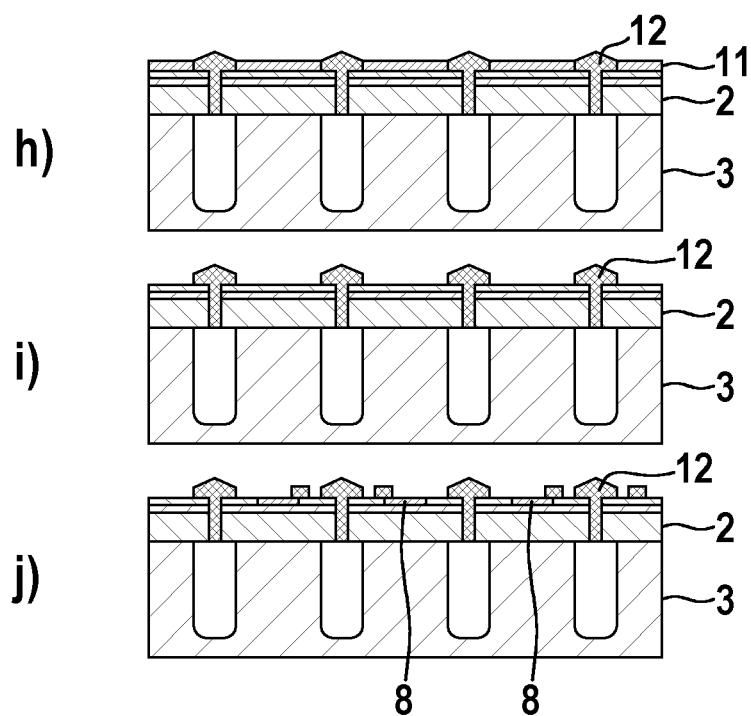
Figure 4:
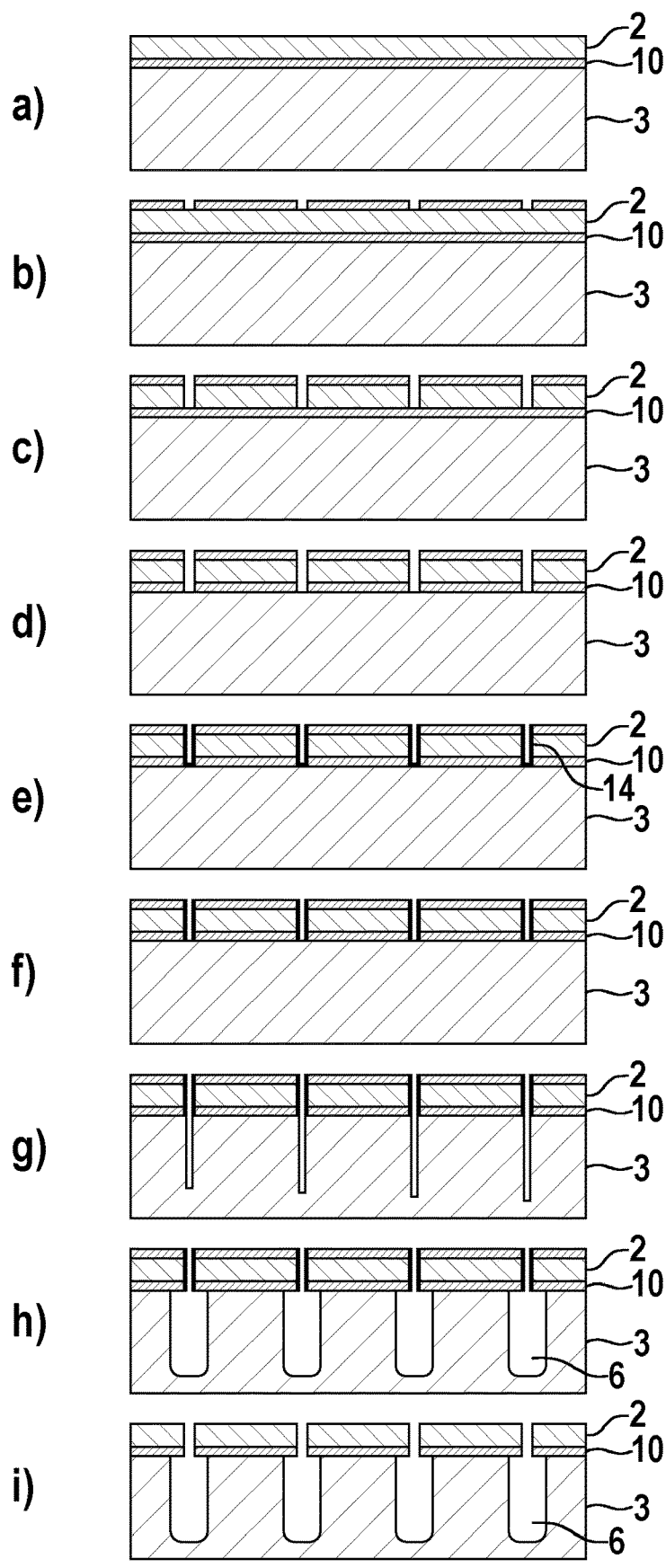
Figure 5:
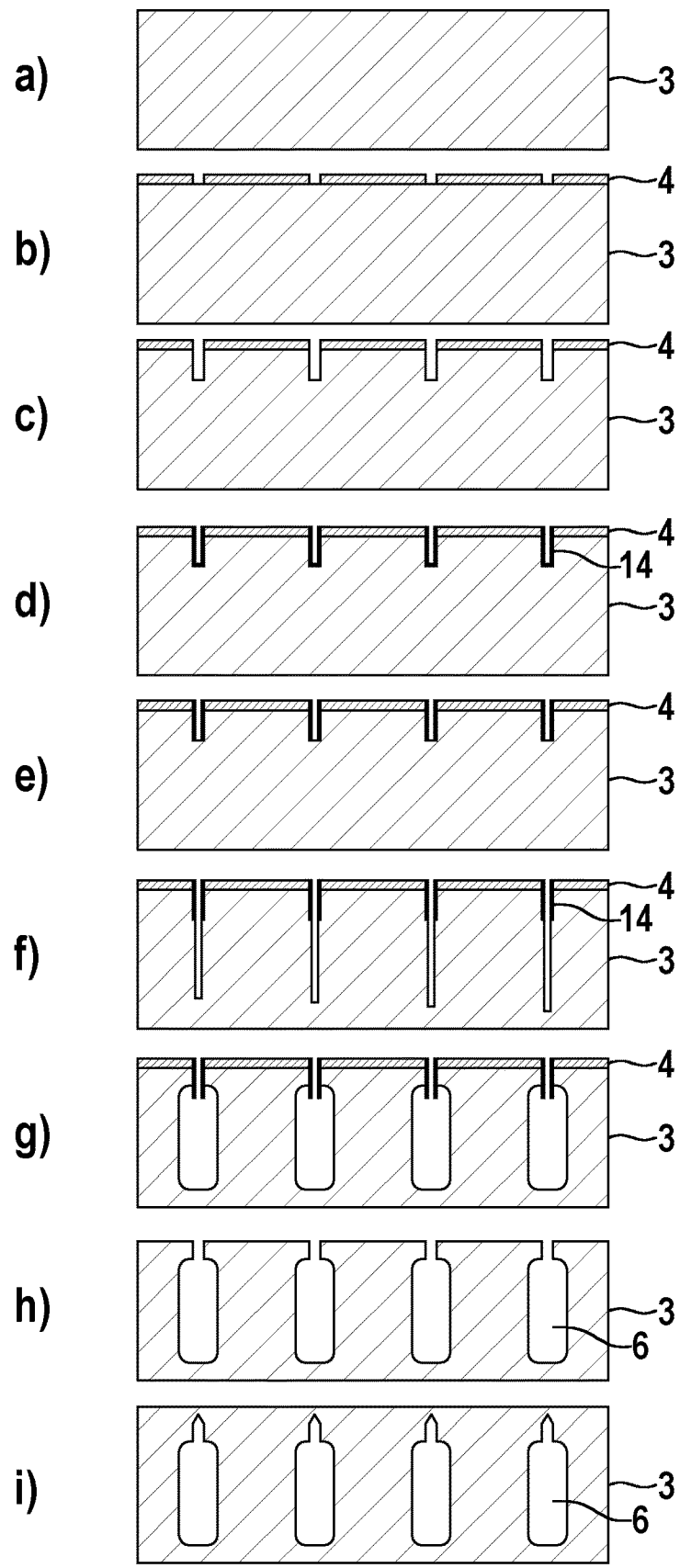
FIGS. 5a-5i show a process flow for embedding a cavity in the substrate with a homogeneous mono-layered substrate.

Sealing the cavities 6/microchannels can be made locally using a deposition mask 11 in step of FIG. 3g, so that a specific structure with a pattern covering the trenches 5 is obtained.

So, instead of re-growing a semiconductor material to obtain the active area for the electronic or optoelectronic components to be embedded, the trench can also be closed by depositing a functional material. Hence the microchannels are formed together with the electronic components. This approach is particularly interesting for power devices: The optimal dimensions for cooling, where channel width and spacing are in the order of tens of micrometers, matches the source-drain spacing for lateral GaN power devices rated in the order of 0.1 kV to 1 kV.

For example, the trenches can be made on the location where the contacts of an active component will later be realized, such as the source and drain pad of a transistor. The trench can then be sealed by depositing a high thermal conductive material (e.g. copper) to create a low thermal resistance path between the hotspot in the active area and the microchannel cooling. For instance, copper may be electroplated on the source/drain pad of a transistor, which hermetically seals the microchannel. The copper also has a good electrical conductivity, which improves the electrical performance of the device.

Alternatively, the trenches may be sealed by selectively growing n-type GaN. This n-type semiconductor functions as an excellent contact to the electrical component to be integrated.

Further as shown in FIG. 3h a metal material 12 may be deposited such as copper, e.g. by means of sputtering or other deposition methods such as (including but not limited to: MOCVD, low pressure chemical vapor deposition, plasma-enhanced chemical vapor deposition, microwave-assisted chemical vapor deposition), atomic layer deposition, electron-beam evaporation, sputtering, electrodeposition, and spin coating. The resulting seal may function as a conductor, such as a metal pad or a doped semiconductor, isolator, in case of an oxide or a polymer, or a semiconductor.

In step of FIG. 3i the deposition mask layer 11 may be removed together with the deposited metal material thereon so that only the metal material closing the opening of the trenches 5 remain.

As shown in FIG. 3j the remaining upper surface of the integrated device may be processed to embed electronic or optoelectronic components 8.

Further, each of the FIGS. 4a-4i shows a cross-sectional view through the formed device after the respective fabrication step according to a further embodiment. FIGS. 4a-4i show the process for embedding a cavity in the substrate with a heterogeneous top surface semiconductor layer and support semiconductor or insulating layer, with one or more additional insulating layer in between. This is for example the case for silicon on insulator (SOI) or AlGaN/GaN on SOI.

Substantially the process of FIGS. 4a-4i is similar to that of FIGS. 3a-3g with the difference that several trench etching processes are applied to allow an anisotropic trench etching to define the deepness of the cavities to be formed in the support layer.

So, for the given example of a SOI substrate, a heterogeneous substrate is formed having a Si support layer and intermediate layer of $SiO_2$ and a Si layer as the upper layer. Trench etching through the upper layer 2, the intermediate layer 10 and into the support layer require different etching processes, particularly using different etching materials.

In case of poor or no selectivity of the etching material with respect to the material of the upper layer(s) 2, such as SOI with microchannels embedded in the support layer 3, where the upper layer 2 and the support layer 3 may be of the same material, an addition etching mask can be conformally deposited on the walls of the trenches 5 etched through the upper layer(s) 2. While the steps of FIGS. 4a-4d correspond to the before described steps of etching trenches through the upper layer(s), steps 4e provides the depositing of an etch resist material 14 on the sidewalls of the trenches 5, which prevents the upper layer 2 to be affected during the etching step in FIG. 4h. The following process steps substantially correspond to the steps of FIGS. 3e to 3g.

With respect to the FIGS. 5a-5i, each of the figures shows a cross-sectional view through the formed device after the respective fabrication step according to a further embodiment. Finally, as shown in FIGS. 5a-5i this approach can also be applied to bulk semiconductors, such as silicon, gallium oxide or bulk GaN in a single layer which combines the support layer and the upper layer. In this case, after creating an anisotropic first etch in the top of the semiconductor substrate, the same approach as in FIG. 4e can be made by depositing a etch mask on the sidewalls of the formed trenches 5. This is followed by a second anisotropic etch for defining the deepness of the cavities/microchannels and an isotropic etch to create the embedded below the surface and beneath the active area. After generating the embedded cavities, the same approach as in either FIG. 1h or FIGS. 3h-j can be used to seal the cavities.

Figure 6A:
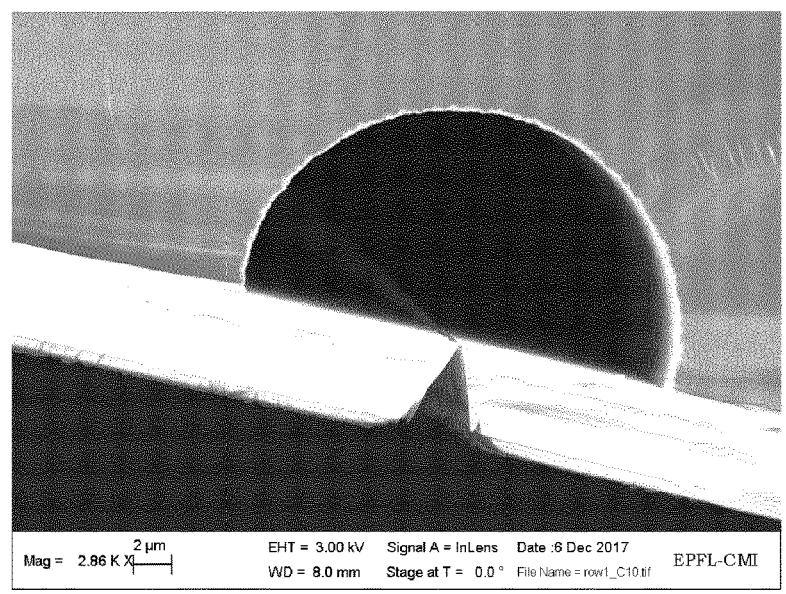
FIG. 6a shows a cross-section after performing an isotropic gas etch in a silicon substrate through a narrow opening etched in a GaN upper layer, where the upper layer was partially closed using a MOCVD regrowth after fabricating a cavity.

FIG. 6a shows a cut through a scanning electron microscope (SEM) image of microchannels fabricated in silicon underneath a GaN epilayer. As can be seen, a roughly 10 μm microchannel underneath the upper layer using a $XeF_2$ gas etch has been formed.

Figure 6B:
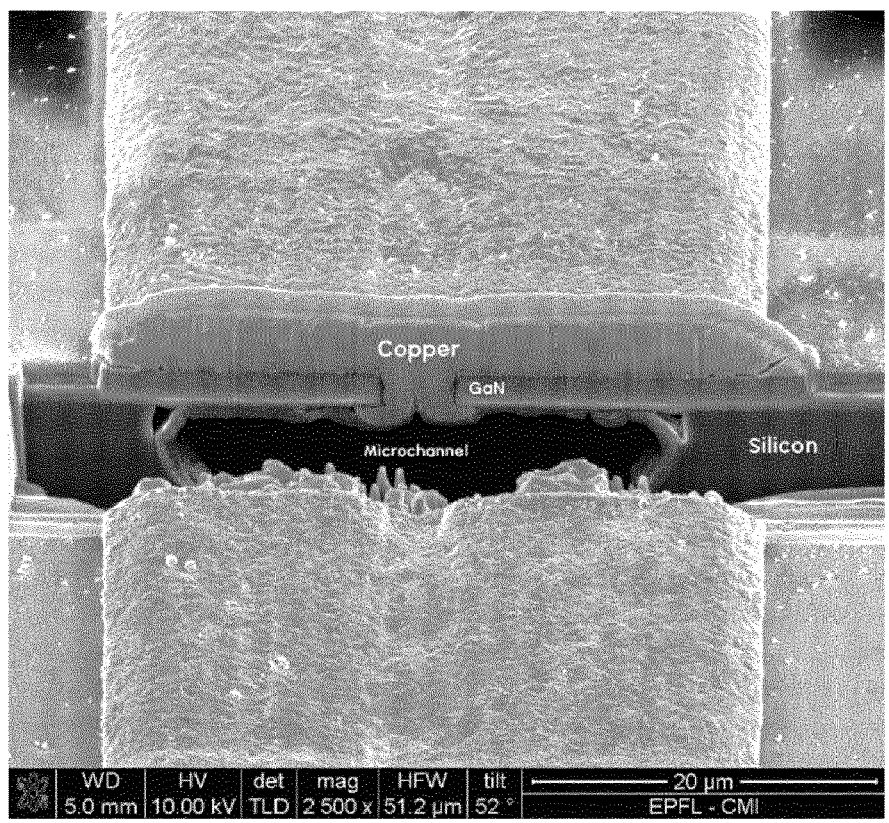
FIG. 6b shows a cross-section of an embedded microchannel, closed by electrodeposition of copper to seal the trench in an AlGaN/GaN epilayer.

FIG. 6b shows an SEM image after sealing the hole by electroplating copper, which matches to the fabrication method explained in FIGS. 3a-3k. Using this approach, a hermetic leak-tight seal can be obtained.

Figure 6C:
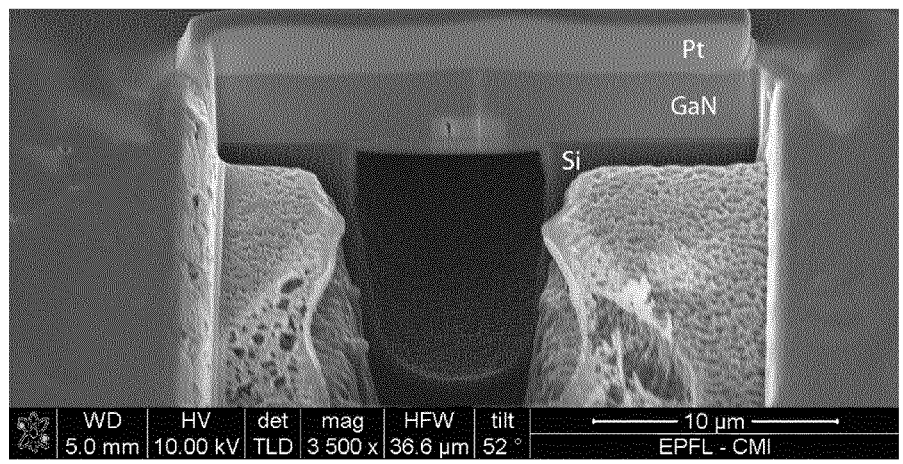
FIG. 6c shows a cross-section of embedded microchannels, where the opening in the upper layer was closed using a uniform MOCVD regrowth after fabricating a cavity inside the substrate.

FIG. 6c shows an SEM image after MOCVD regrowth, showing a smooth surface with an embedded channel underneath. This corresponds to the fabrication method described in FIGS. 1a-1i.

Figure 6D:
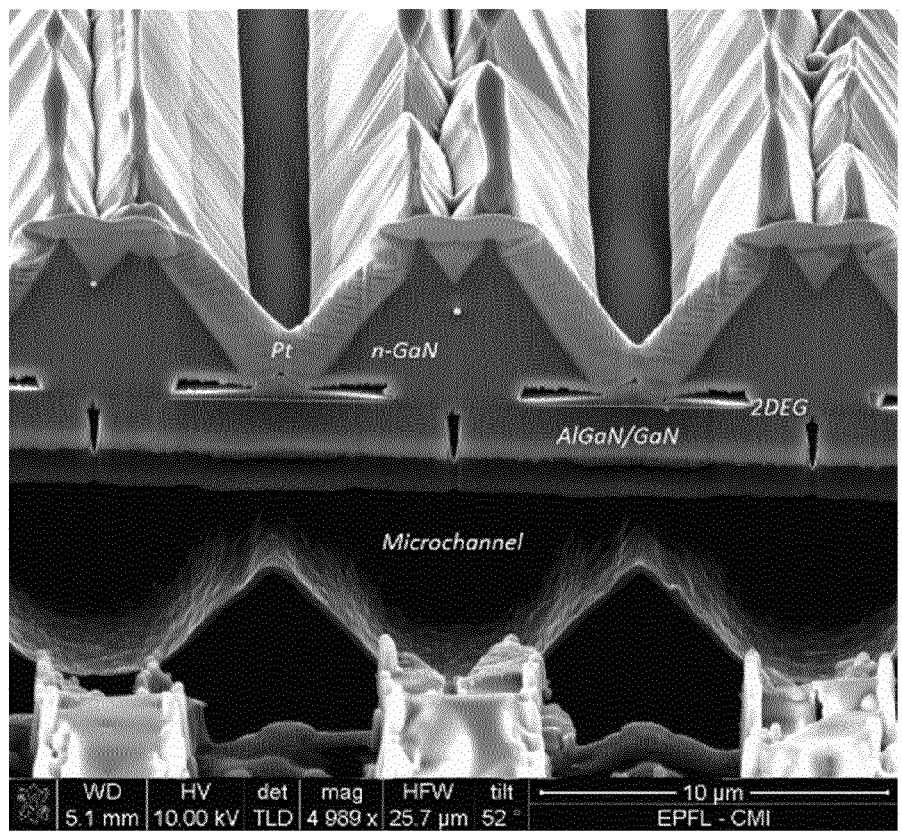
FIG. 6d shows a cross-section of embedded microchannels, where the opening in the upper layer was closed using selective n-doped GaN regrowth.

FIG. 6d shows an SEM image where the opening in the GaN layer was sealed by selectively re-growing n-type GaN. Using this approach, the n-GaN can directly be used as an Ohmic contact to the two-dimensional electron gas in the AlGaN/GaN structure.

To facilitate to seal the channels and to reduce the damage to the epilayer, it is important to make the area used for the openings of the trenches as small as possible. An interesting strategy here is to etch dot-shaped trenches in the upper layer, spread at a certain distance. By performing the isotropic etch in the substrate, the cavities will coalesce underneath the upper layer, forming a continuous microchannel.

Figure 7A:
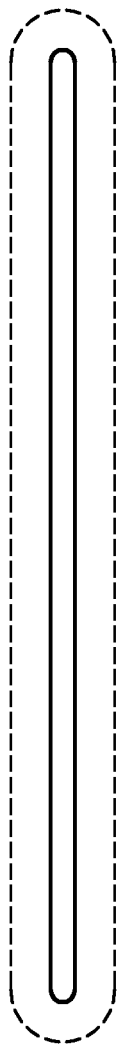
FIG. 7a shows a top view of an opening of a longitudinal trench etched in the upper layer, indicated with a solid outline, and the resulting microchannel after performing an isotropic etch, indicated in dashed lines.
Figure 7B:
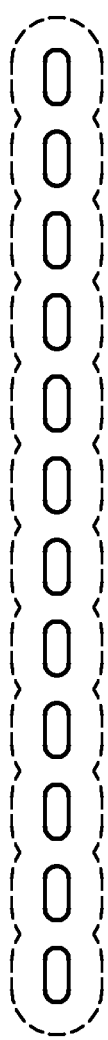
FIG. 7b shows the resulting pattern after etching dot-shaped trenches in the upper layer, wherein wavy channels are formed inside the substrate.

FIG. 7a shows a top view of an opening etched in the epilayer, indicated with a solid outline, and the resulting microchannel after performing an isotropic etch, indicated in dashed lines. The resulting embedded channel has a larger size than the initial opening. FIG. 7b shows the resulting pattern after etching dot-shaped trenches in the upper layer. Wavy channels will be formed inside the substrate. This channel with wavy sidewalls will also help in improving the cooling, as it results in an increased heat transfer coefficient due to turbulences of the cooling fluid. Additionally, since the two sides of the upper layer are still connected, it prevents the formation of wing tilt, which can be detrimental for coalescence by using MOCVD growth.

According to FIGS. 8a to 8d, several embodiments are shown which illustrate how to connect the embedded microchannels to an inlet port 21 and outlet port 22. Each of the FIGS. 8a to 8d show an embodiment with a top view and a cross-sectional view. The inlet/outlet ports 21, 22 serve to connect each of the microchannels 23 within an integrated device to provide an inlet or outlet for the fluid to flow through the integrated device.

Figure 8:
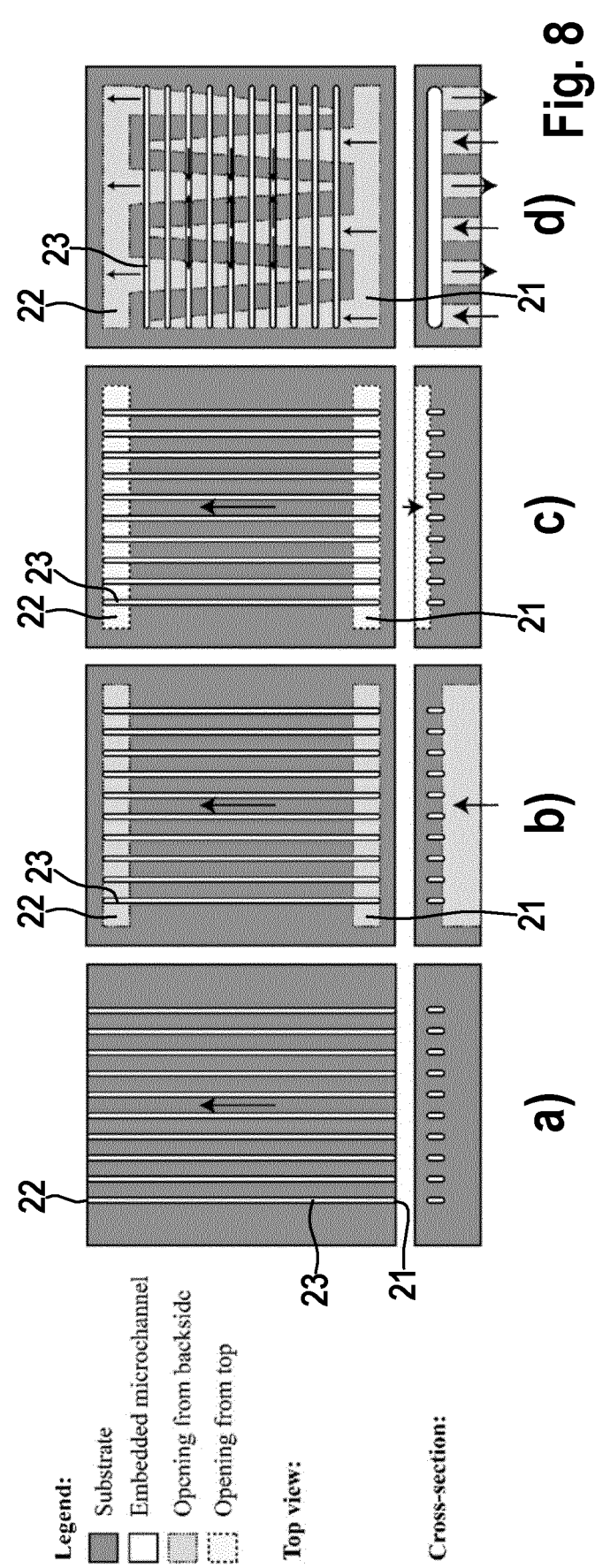
FIG. 8a shows a substrate with embedded microchannels where the microchannels are exposed at the edge of the chip, these openings are used as an inlet and outlet.
FIG. 8b shows a substrate with embedded microchannels where an inlet and outlet opening are realized in the backside of the substrate.
FIG. 8c shows a substrate with embedded microchannels where an inlet and outlet opening are realized on top of the chip, through the upper layer.
FIG. 8d shows a substrate with embedded microchannels where manifold channels are etched in the back of the substrate.

FIG. 8a shows a substrate with embedded microchannels 23 where openings of the microchannels 23 are exposed at the edge of the chip, these openings may be used as an inlet port 21 and outlet port 22.

FIG. 8b shows a substrate with embedded microchannels 23 where an inlet port 21 and outlet port 22 are realized in the backside of the substrate. This is made by a backside etching until a backside trench reaches the formed microchannels 23. It is preferred to arrange a longitudinal inlet port 21 and/or outlet port 22 backside trench across (perpendicular) the longitudinal extension of the microchannels.

FIG. 8c shows a substrate with embedded microchannels 23 where an inlet port 21 and outlet port 22 are realized on top (upper active surface) of the upper layer, through the upper layer(s).

FIG. 8d shows a substrate with embedded microchannels 23 where manifold channels forming the inlet port 21 and outlet port 22 are etched in the backside of the substrate. The backside manifold channels can be shaped in a comb-structure crossing the extension of the microchannels 23, thereby shortening the length of the single microchannels 23 between the inlet port 21 and outlet port 22 so that the flow resistance can significantly be reduced. In the present example the manifold channels can be comb-shaped meshing each other so that an inlet channel is connected to an outlet channel via a piece of the microchannel 23 as can be seen in the cross-sectional view of FIG. 8d.

Figure 9A:
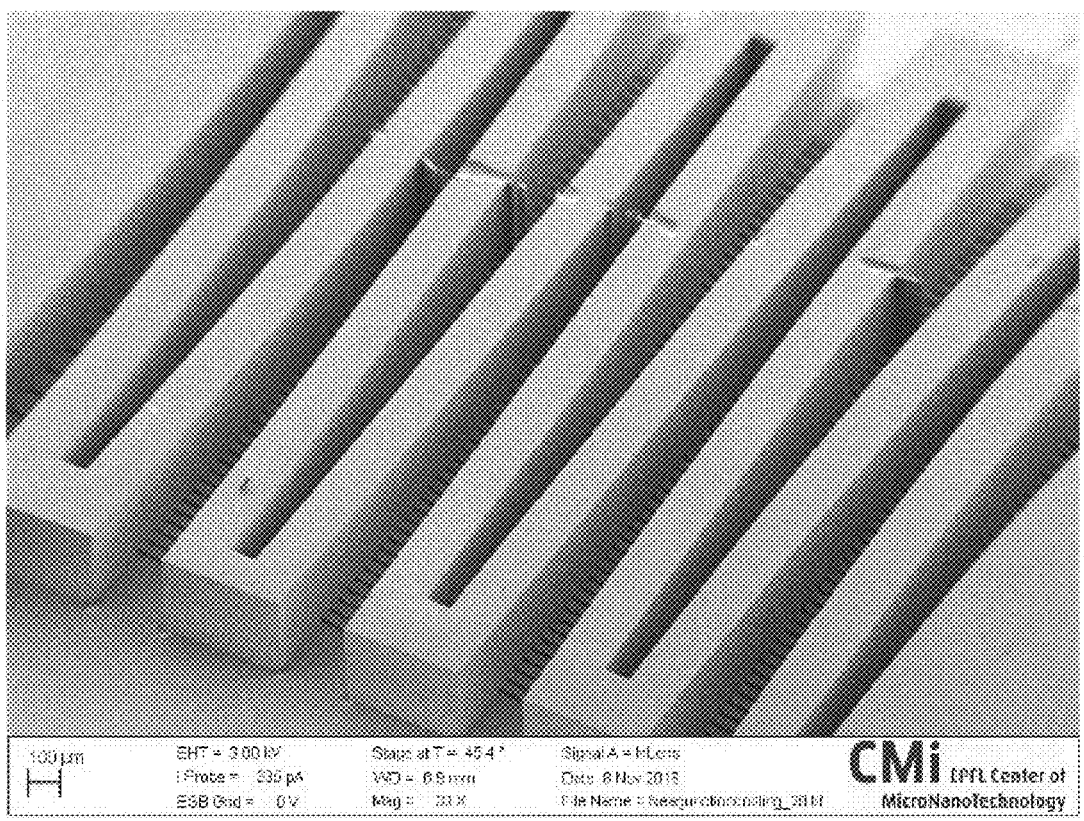
FIGS. 9a and 9b show a manifold structure with 10 and 4 inlet and outlet channels, respectively.
Figure 9B:
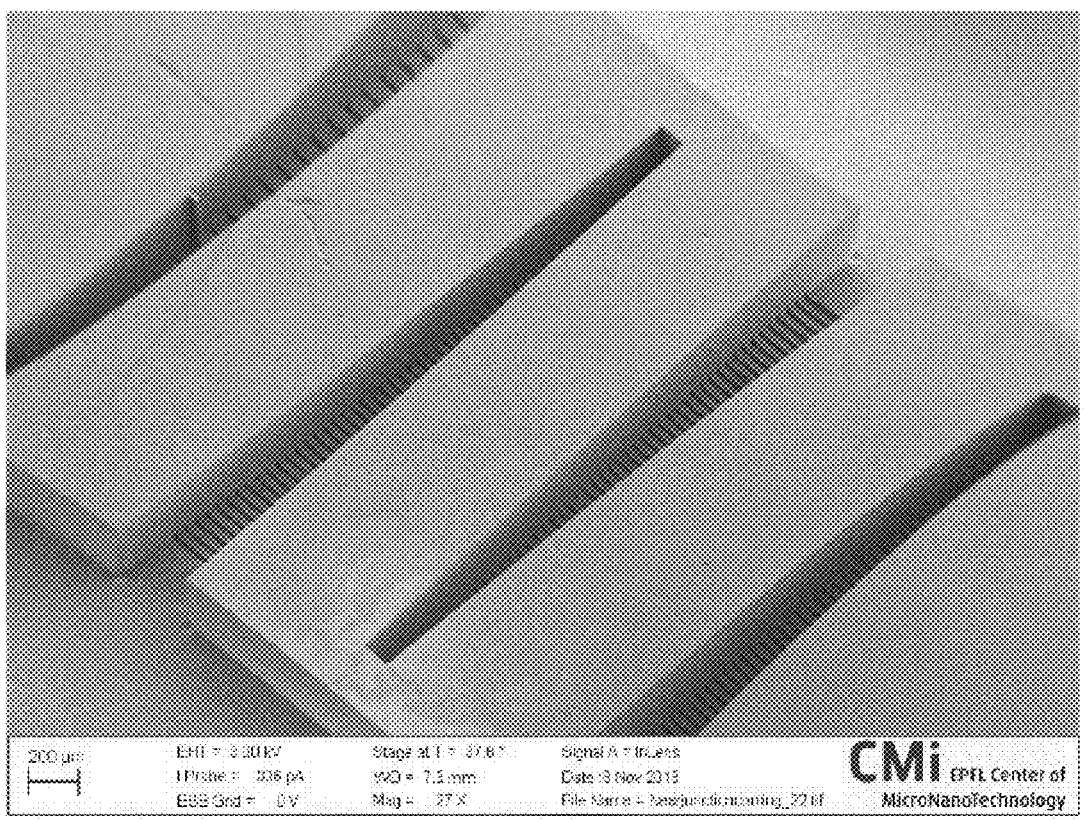

By etching multiple inlet and outlet channels in the backside, an MMC structure could be obtained, as shown in FIG. 8d. In a cooling application, the cooling fluid is fed through the inlet port, passes through the manifold inlet channels and gets distributed over the microchannels. The cooling fluid is forced to make a 180° turn through the microchannel 23 where it absorbs the heat. The heated cooling fluid is collected in the manifold outlet channels and is output at the outlet port 22. SEM images of such structure are shown in FIG. 9a and FIG. 9b, showing a manifold structure with 10 inlet and 4 outlet channels, respectively.

The invention claimed is:

1. Method for fabricating an integrated electronic device with a microchannel, comprising the steps of:
   Providing a homogeneous or heterogeneous substrate with one or more layers of material, respectively;
   Forming at least one trench in the upper surface and through the upper layer using an etching process, particularly using a high aspect ratio etching process;
   Sealing the trench by closing the opening of the trench on an upper surface of the upper layer;
   wherein a manifold structure including an inlet and/or an outlet port is provided through the support layer, wherein the manifold structure has two interlaced comb-shaped channel structures so that between neighboring teeth of different channel structures the microchannels are arranged so that fluid may flow from one channel structure to the other channel structure via the microchannels.

2. Method according to claim 1, wherein a cavity etching process is performed through the at least one trench to form a cavity and/or the microchannel, wherein in particular,
   the cavity etching process is an isotropic etching process made in a layer of the heterogeneous substrate which is not the upper layer.

3. Method according to claim 2, wherein the cavity etching process is followed by a wet or dry oxidizing step growing an oxide layer at the inner walls of the cavity/microchannel for electrical isolation.

4. Method according to claim 1, wherein the trench is sealed by closing the opening of the trench on the upper surface by means of at least one of
   an epitaxial growth of a semiconductor material;
   a deposition of a dielectric, semiconducting or conductive material, by means of at least one of evaporation, sputtering, chemical vapor deposition, physical vapor deposition, coating, and atomic layer deposition; and
   a deposition of an isolating material.

5. Method according to claim 1, wherein at least an upper layer of the substrate is a semiconductor layer that provides an active area.

6. Method according to claim 1, wherein the substrate is made of a homogeneous material, which particularly includes one of GaN, $Ga_2O_3$, Si, AlGaN, InGaAs and GaAs or wherein,
   the substrate is made of a heterogeneous material, which particularly comprises of a plurality of layers at least one including semiconductor materials including one of GaN, $Ga_2O_3$, Si, InGaAs, AlGaN, and GaAs.

7. Method according to claim 6, wherein a support layer of the substrate is made of a non-semiconductor material such as SiO2, or sapphire, or of a semiconductor material, such as Si, SiC or diamond.

8. Method according to claim 1, wherein the cavities are formed as longitudinal microchannels.

9. Method according to claim 8, wherein dot shaped trenches are provided along the extension of the microchannel to be formed with a distance to each other, wherein by a cavity etching process a cavity is etched through each of the trenches underneath the upper layer so that the formed cavities join to form the microchannel with a wavy wall structure.

10. Method according to claim 1, wherein an inlet and/or outlet channel is formed on a backside of the substrate, particularly by etching a backside trench from the backside until the microchannels are reached.

11. Method according to claim 10, where the backside trenches are longitudinal and extend across the extension of the microchannels.

12. Method according to claim 1, wherein an electronic component is formed in the upper layer, particularly after the trench has been sealed.

13. Method according to claim 1, wherein an inlet and/or outlet port is provided through the upper layer and/or through the support layer.

14. Integrated electronic device with a microchannel, produced by the steps of:
   Providing a homogeneous or heterogeneous substrate with one or more layers of material, respectively;
   Forming at least one trench in the upper surface and through the upper layer using an etching process, particularly using a high aspect ratio etching process;
   Sealing the trench by closing the opening of the trench on an upper surface of the upper layer;
   wherein a manifold structure including an inlet and/or an outlet port is provided through the support layer, wherein the manifold structure has two interlaced comb-shaped channel structures so that between neighboring teeth of different channel structures the microchannels are arranged so that fluid may flow from one channel structure to the other channel structure via the microchannels.

15. Integrated electronic device, comprising:
   a homogeneous or heterogeneous substrate with one or more layers of material, respectively; wherein at least an upper layer of the substrate is a semiconductor layer provides an active area;
   at least one trench in the upper surface and through the upper layer;
   a seal onto the opening of the trench on an upper surface of the upper layer to form a microchannel for flowing a fluid;
   wherein a manifold structure including an inlet and/or an outlet port is provided through the support layer, wherein the manifold structure has two interlaced comb-shaped channel structures so that between neighboring teeth of different channel structures the microchannels are arranged so that fluid may flow from one channel structure to the other channel structure via the microchannels.

16. Integrated electronic device according to claim 15, wherein the microchannel is formed directly under the upper layer, wherein the microchannel extends underneath active electrical components formed in the active area.

17. Integrated electronic device according to claim 15, wherein the trench is sealed by means of at least one of
a deposition of a dielectric, semiconducting or conductive material, by means of at least one of evaporation, sputtering, chemical vapor deposition, physical vapor deposition, coating, and atomic layer deposition; and
a deposition of an isolating material.

18. Integrated electronic device according to claim 15, wherein the substrate is made of a homogeneous material, which particularly includes one of GaN, $Ga_2O_3$, Si, AlGaN, and GaAs; or,
wherein the substrate is made of a heterogeneous material, which particularly comprises of a plurality of layers at least one including semiconductor materials including one of GaN, $Ga_2O_3$, Si, AlGaN, and GaAs.

19. Integrated electronic device according to claim 18, wherein a support layer of the substrate is made of a non-semiconductor material such as SiO2 or sapphire, or of a semiconductor material such as Si, SiC or diamond.

20. Integrated electronic device according to claim 15, wherein dot shaped trenches are provided along the extension of the microchannel with a distance to each other, wherein the microchannel has a wavy wall structure.

21. Integrated electronic device according to claim 15, wherein an inlet and/or outlet channel are provided as backside trenches on a backside of the substrate, wherein the backside trenches are longitudinal and extend across the extension of the microchannels.

22. Integrated electronic device according to claim 15, wherein an electronic component is provided in the upper layer.

* * * * *